(12) United States Patent
Chen et al.

(10) Patent No.: US 12,342,494 B2
(45) Date of Patent: Jun. 24, 2025

(54) ADJUSTABLE RACK ASSEMBLY AND CABINET USING SAME

(71) Applicant: Delta Electronics, Inc., Taoyuan (TW)

(72) Inventors: Jhih-Hao Chen, Taoyuan (TW);
Ming-Tang Yang, Taoyuan (TW);
Teng-Chiao Shen, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 279 days.

(21) Appl. No.: 17/900,489

(22) Filed: Aug. 31, 2022

(65) Prior Publication Data

US 2023/0422425 A1    Dec. 28, 2023

(30) Foreign Application Priority Data

Jun. 23, 2022 (CN) .......................... 202221580895.7

(51) Int. Cl.
*H05K 7/18* (2006.01)
*H05K 7/14* (2006.01)

(52) U.S. Cl.
CPC ........... *H05K 7/183* (2013.01); *H05K 7/1488* (2013.01)

(58) Field of Classification Search
CPC ............................ H05K 7/1488; H05K 7/183
See application file for complete search history.

(56) References Cited

U.S. PATENT DOCUMENTS

| 11,818,862 | B1* | 11/2023 | Krietzman | H05K 7/18 |
| 2011/0304244 | A1* | 12/2011 | Cottuli | H05K 7/1488 |
| | | | | 312/223.1 |
| 2012/0018389 | A1* | 1/2012 | Fan | H05K 7/1488 |
| | | | | 211/26 |
| 2020/0077533 | A1* | 3/2020 | Lu | H05K 7/1488 |
| 2022/0338366 | A1* | 10/2022 | Chang | F16B 7/0493 |

* cited by examiner

*Primary Examiner* — Matthew W Ing
(74) *Attorney, Agent, or Firm* — KIRTON McCONKIE; Evan R. Witt

(57) ABSTRACT

An adjustable rack assembly, which may be used in a cabinet, includes a rail and a sliding component. The rail extends along a first direction, and includes a rail body, a bent portion and plural positioning grooves. The bent portion protrudes inwardly from an outer edge of the rail body, and the plural positioning grooves are disposed on the bent portion along the first direction. The sliding component includes a sliding body, a limiting portion and a guiding groove. The limiting portion is connected to the sliding body, and the guiding groove and the bent portion are mutually matched. When the sliding component is misaligned with the plural positioning grooves in the first direction, the sliding component is allowed to slide in the first direction. When the sliding component is engaged with the positioning groove, the sliding component is locked on the rail.

18 Claims, 16 Drawing Sheets

ADJUSTABLE RACK ASSEMBLY AND CABINET USING SAME

FIELD OF THE INVENTION

The present disclosure relates to a rack assembly, and more particularly to an adjustable rack assembly and a cabinet using the same.

BACKGROUND OF THE INVENTION

In a cabinet structure, the internal frame includes rack assemblies configured to carry a server and other types of electronic devices installed thereon. The conventional rack assemblies of the cabinet frame are usually fastened by screw locking or welding. Since the server and the electronic devices have different sizes, the rack assemblies also need to meet the adjustable requirement for carrying the server and the electronic devices installed thereon. However, the conventional rack assembly is fastened through a simple screw method or adjusted through a shrapnel structure. Although the conventional rack assembly meets the adjustable requirement, but it is inconvenient to install and adjust, and the structural support capacity is limited.

Therefore, there is a need of providing an adjustable rack assembly and a cabinet using the same, wherein the adjustable rack assembly includes a sliding component and a rail, which are made by sheet metal parts and adjusted in an alignment or misalignment of a first direction and a second direction, so as to achieve the position adjustment of an equipment-fixing seat thereof, improve the structural support capacity, simplify the adjustment process, and obviate the drawbacks encountered by the prior arts.

SUMMARY OF THE INVENTION

An object of the present disclosure is to provide an adjustable rack assembly and a cabinet using the same. A sliding component and a rail made by sheet metal parts are adjusted in an aligned arrangement or a misaligned arrangement of a first direction and a second direction, so as to achieve the position adjustment of an equipment-fixing seat thereof. Compared with the conventional rack assembly simply fixed through a screw, an enhanced supporting for the equipment carried on the rack assembly is provided through the engagement between the sliding component and the rail made by sheet metal parts, and the adjustment process is simplified.

Another object of the present disclosure is to provide an adjustable rack assembly and a cabinet using the same. By matching a positioning protrusion with one of the plurality of positioning grooves on the rail, the sliding component is operated in a locked state or an unlocked state on the rail extended along a first direction. The positioning protrusion is integrally formed on the sliding body of the sliding component or combined with a fixing component. Moreover, the positioning protrusion is driven to displace in a second direction by a fastening element or a magnetic element. When the positioning protrusion is engaged with the positioning groove of the rail in the first direction, the sliding component is operated in the locked state, so that the sliding component is locked on the rail firmly. When the positioning protrusion is misaligned with the positioning groove of the rail in the first direction, the sliding component is operated in the unlocked state, so that the sliding component is allowed to slide relative to the rail in the first direction. Since the sliding component, the fixing component and the rail are made by sheet metal parts, for example, the locked state of the sliding component is maintained through the engagement of the positioning protrusion and the positioning groove, and the structural support capacity greater than the conventional fixing method of the screw is further provided through the engagement of the positioning protrusion and the positioning groove. It is beneficial for the sliding component to be further combined with an equipment-fixing seat for carrying and fixing the server equipment thereon and maintaining the stability of the entire structure. In addition, the rail and the sliding component are allowed to be paired and form a rack unit in use. When the sliding body of the sliding component is extended along a third direction, the sliding bodies of the two rack units are further connected with each other to form a column structure, which is constructed between the two rack units arranged along the first direction and parallel to each other. Thus, the structural support capacity of the adjustable rack assembly is further enhanced, the varieties of applications are increased, and the competitiveness of products is enhanced.

In accordance with an aspect of the present disclosure, an adjustably rack assembly is provided and includes a rail and a sliding component. The rail is extended along a first direction and includes a rail body, at least one bent portion and a plurality of positioning grooves. The at least one bent portion protrudes inwardly from an outer edge of the rail body to form an accommodation space, and the plurality of positioning grooves are disposed on the bent portion and arranged along the first direction. The sliding component includes a sliding body, a limiting portion and at least one guiding groove. The at least one guiding groove is spatially corresponding to the at least one bent portion, the limiting portion is connected to the sliding body and accommodated in the accommodation space, and the at least one guiding groove and the at least one bent portion are mutually matched. When the sliding component is misaligned with the plurality of positioning grooves in the first direction, the sliding component is allowed to slide relative to the rail in the first direction. When the sliding component is engaged with one of the plurality of positioning grooves on the trail, the sliding component is fastened on the rail.

In accordance with another aspect of the present disclosure, a cabinet is provided and includes an adjustable rack assembly. The adjustable rack assembly includes a rail and a sliding component. The rail is extended along a first direction and includes a rail body, at least one bent portion and a plurality of positioning grooves. The at least one bent portion protrudes inwardly from an outer edge of the rail body to form an accommodation space, and the plurality of positioning grooves are disposed on the bent portion and arranged along the first direction. The sliding component includes a sliding body, a limiting portion and at least one guiding groove. The at least one guiding groove is spatially corresponding to the at least one bent portion, the limiting portion is connected to the sliding body and accommodated in the accommodation space, and the at least one guiding groove and the at least one bent portion are mutually matched. When the sliding component is misaligned with the plurality of positioning grooves in the first direction, the sliding component is allowed to slide relative to the rail in the first direction. When the sliding component is engaged with one of the plurality of positioning grooves on the trail, the sliding component is fastened on the rail.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
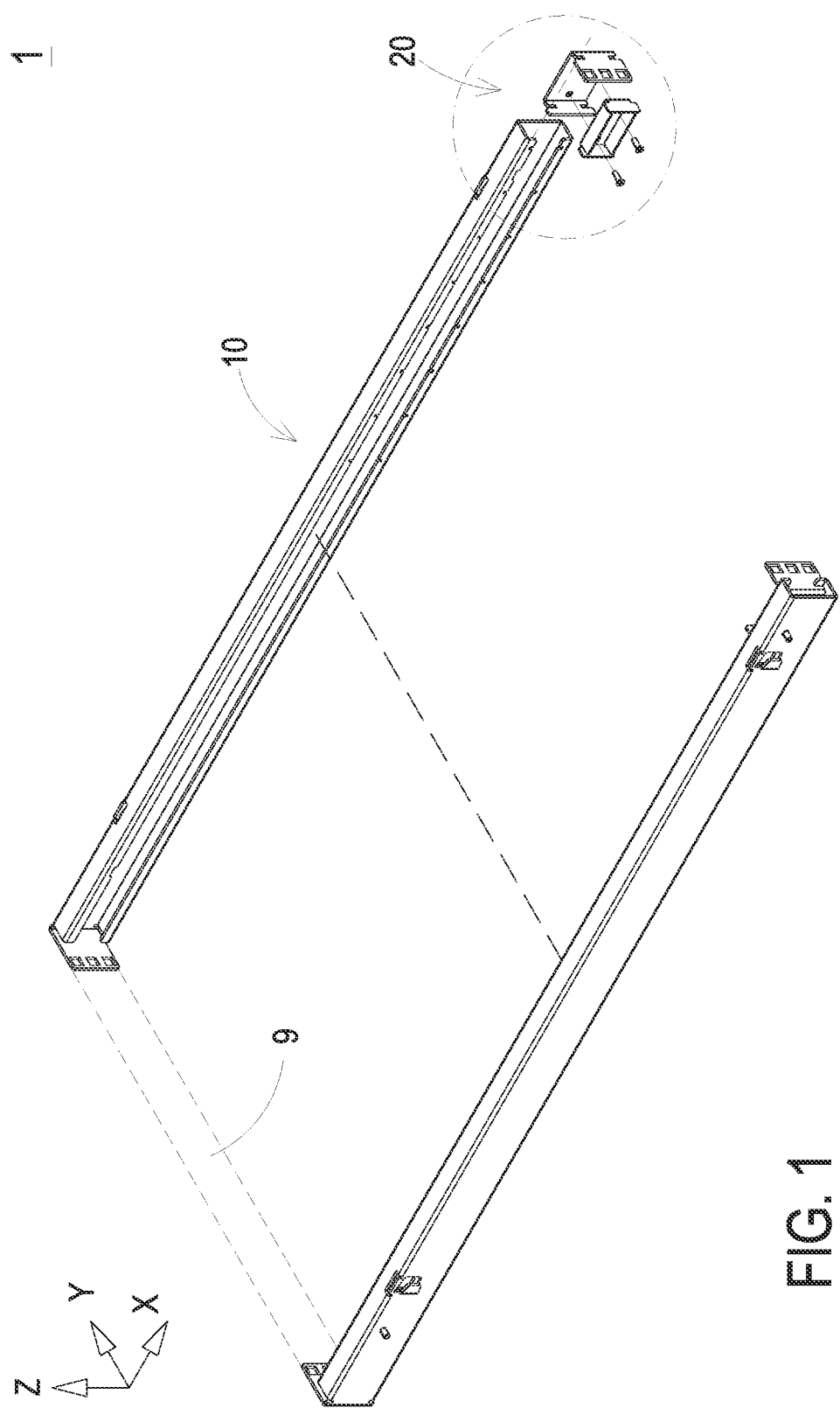
FIG. 1 is an exploded view illustrating an adjustable rack assembly according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "upper," "lower," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
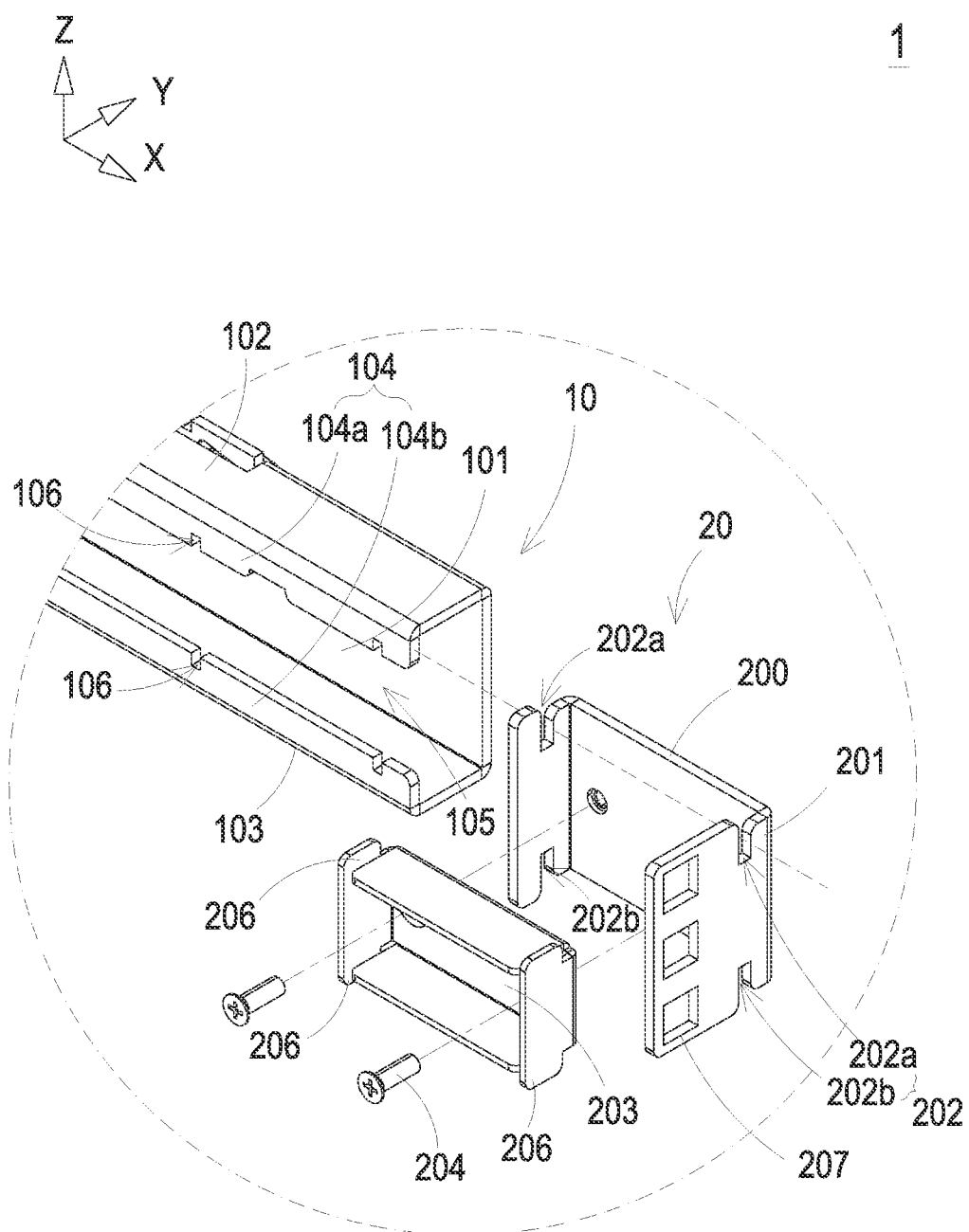
FIG. 2 is an enlarged and exploded view illustrating the adjustable rack assembly according to the first embodiment of the present disclosure.
Figure 3A:
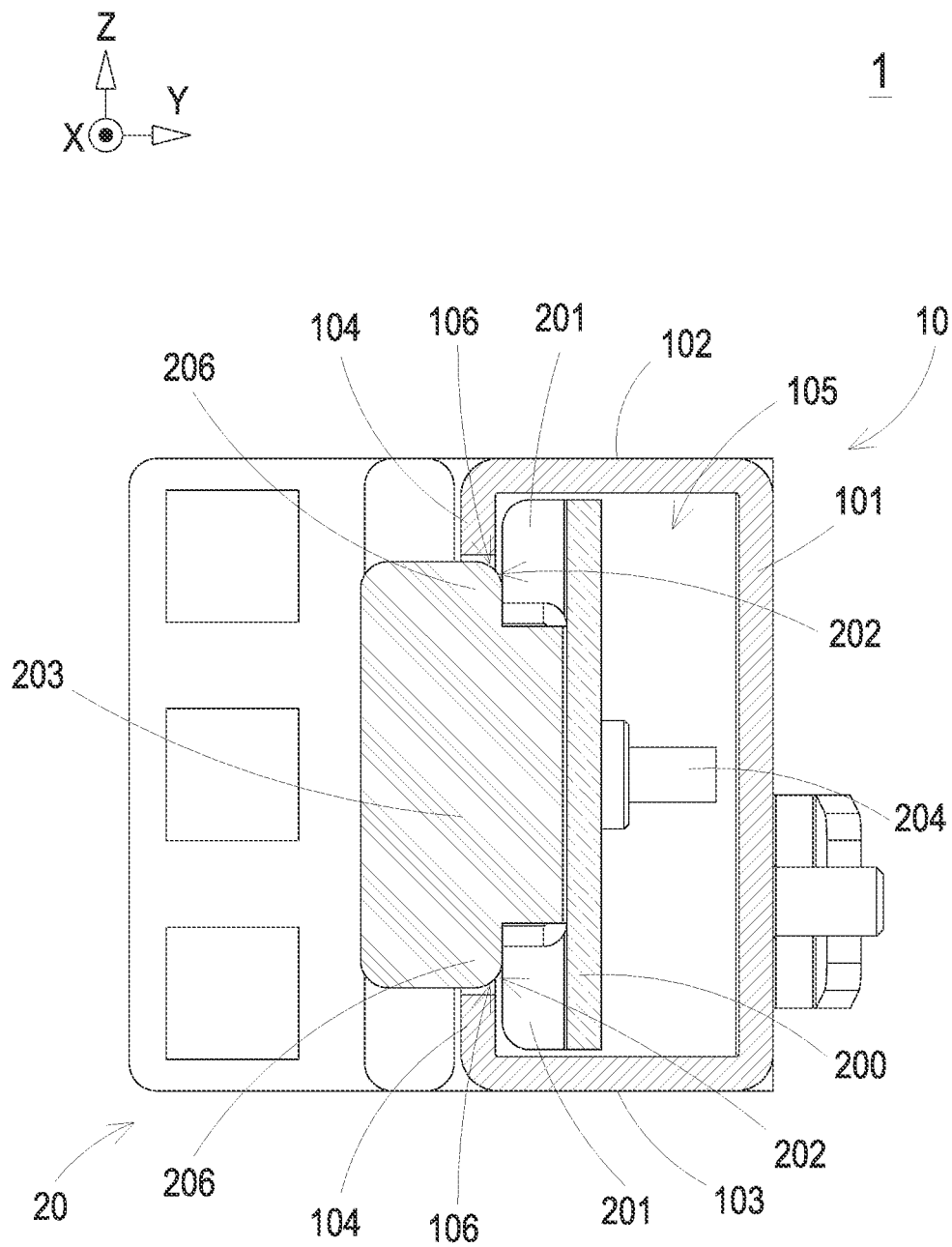
FIG. 3A is a cross-section view illustrating the adjustable rack assembly operated in a locked state according to the first embodiment of the present disclosure.
Figure 3B:
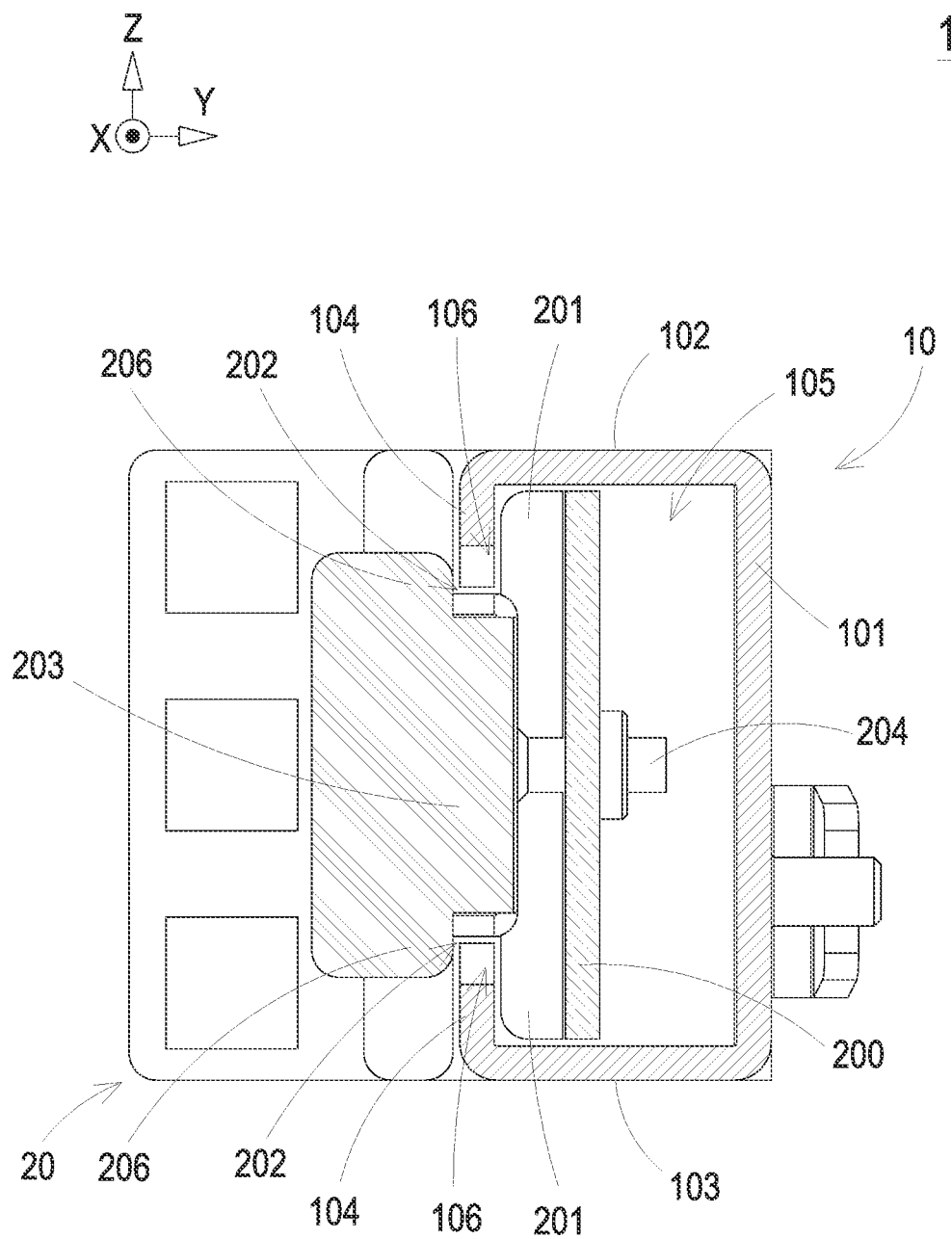
FIG. 3B is a cross-section view illustrating the adjustable rack assembly operated in an unlocked state according to the first embodiment of the present disclosure.

FIG. 1 is an exploded view illustrating an adjustable rack assembly according to a first embodiment of the present disclosure. FIG. 2 is an enlarged and exploded view illustrating the adjustable rack assembly according to the first embodiment of the present disclosure. FIGS. 3A and 3B are cross-section views respectively illustrating the adjustable rack assembly operated in a locked state and an unlocked state according to the first embodiment of the present disclosure. In the embodiment, an adjustable rack assembly 1 is, for example, constructed on an upright or lying down frame of a cabinet 9 and served as a rack unit. The adjustably rack assembly 1 includes a rail 10 and a sliding component 20. In the embodiment, the rail 10 is extended along a first direction, such as the X axial direction. Preferably but not exclusively, the first direction of the X-axis direction is a horizontal direction or a vertical direction. The present disclosure is not limited thereto.

The rail 10 includes a rail body 101, at least one bent portion 104 and a plurality of positioning grooves 106. Preferably but not exclusively, the at least one bent portion 104 includes a combination of an upper bent portion 104a and a lower bent portion 104b The upper bent portion 104a protrudes inwardly from the upper outer edge 102 toward the lower outer edge 103 of the rail body 101, and the lower bent portion 104b protrudes inwardly from the lower outer edge 103 toward the upper outer edge 102 of the rail body 101, so that the rail body 101, the upper outer edge 102, the lower outer edge 103 and the bent portion 104 collaboratively form an accommodation space 105. Notably, the forming method of the accommodation space 105 by bending the at least one bent portion 104 from the rail body 101 is not an essential feature, and the present disclosure is not limited thereto. Preferably but not exclusively, in other embodiments, one of the upper bent portion 104a and the lower bent portion 104b is omitted. In the embodiment, the plurality of positioning grooves 106 are disposed on the bent portion 104 and arranged along the first direction (i.e., the X axial direction).

The sliding component 20 includes a sliding body 200, a limiting portion 201 and at least one guiding groove 202. The at least one guiding groove 202 is spatially corresponding to the at least one bent portion 104 of the rail 10. In other words, corresponding to the combination of the upper bent portion 104a and the lower bent portion 104b, the at least one guiding groove 202 includes a combination of the upper guiding groove 202a and the lower guiding groove 202b, which are matched with the corresponding upper bent portion 104a and the corresponding lower bent portion 104b, respectively. Certainly, the matching manner of the bent portion 104 and the guiding groove 202 is not limited in the present disclosure. In other embodiments, the number of the bent portion 104 and the guiding groove 202 are adjustable according to the practical requirements. In the embodiment, the siding component 20 is made by a sheet metal part. The sliding body 200, the limiting portion 201 and the guiding groove 202 are integrally formed into one piece by stamping. The sliding component is matched and assembled through an end of the rail 10. The limiting portion 201 is connected to the sliding body 200, and the limiting portion 201 and the sliding body 200 are received in the accommodation space 105, so that the at least one guiding groove 202 and the at least one bent portion 104 are mutually matched with each other, and the sliding component 20 is allowed to slide relative to the rail 10 in the first direction (i.e., the X axial direction).

In the embodiment, the sliding component 20 further includes a fixing component 203, and a positioning protrusion 206 is disposed on the fixing component 203. The positioning protrusion 206 is spatially corresponding to one of the plurality of positioning grooves 106 of the rail 10. Notably, in the embodiment, there are four positioning protrusions 206 disposed on four corners of the fixing component 203. Preferably but not exclusively, the four positioning protrusions 206 are regarded as one set of positioning protrusions 206, and spatially corresponding to the four positioning grooves 106 regarded as one set of the plurality of positioning grooves 106. In other embodiments, the numbers of the positioning protrusions 206 and the corresponding positioning grooves 106 are adjustable according to the practical requirements, and the arrangement and the spaced positions of the positioning grooves 106 are adjustable according to the practical requirements. Preferably but not exclusively, the plurality of positioning grooves 106 are arranged at an equal spaced distance or adjusted in accordance with the size of the sliding component 20. The present disclosure is not limited thereto. Notably, when the positioning protrusion 206 disposed on the fixing component 203 is aligned with one of the plurality of positioning grooves 106 in a second direction, such as the Y axial direction, the positioning protrusion 206 is allowed to displace along the second direction (i.e., the Y axial direction). In the embodiment, the second direction is not parallel to the first direction. Preferably but not exclusively, the first direction and the second direction are perpendicular to each other.

In the embodiment, the fixing component 203 and the positioning protrusion 206 are made by a sheet metal part and integrally formed into one piece by stamping. In the embodiment, the fixing component 203 is further detachably disposed on the sliding body 200 through a fastening element 204 such as an adjusting screw along the second direction (i.e., the Y axial direction). In other embodiments, the connection of the fixing component 203 and the sliding body 200 along the second direction (i.e., the Y axial direction) is implemented through a magnetic element. The present disclosure is not limited thereto. In the embodiment, when the sliding body 200 and the limiting portion 201 of the sliding component 20 are placed into the accommodation space 105 of the rail 10, and the guiding groove 202 and the bent portion 104 are mutually matched, the sliding component 20 is maintained in a misaligned arrangement with the plurality of positioning grooves 106 of the rail 10 in the first direction (i.e., the X axials direction). In that, the sliding component 20 is allowed to slide relative to the rail 10 in the first direction (i.e., the X axial direction).

In the embodiment, the fixing component 203 is configured to be detachably fixed to the sliding body 200 through the fastening element 204 along the second direction (i.e., the Y axial direction). When the positioning protrusion 206 disposed on the fixing component 203 is aligned with one of the plurality of positioning grooves 106 of the rail 10 in the second direction (i.e., the Y axial direction), the fixing component 203 is allowed to be fixed on the sliding body 200 along the second direction (i.e., the Y axial direction) by the fastening element 204. The positioning protrusion 206 disposed on the fixing component 203 and the corresponding positioning groove 106 are driven to engage with each other, and the sliding component 20 is blocked from sliding relative to the rail 10 in the first direction (i.e., the X axial direction). Thus, the sliding component 20 is locked on the rail 10 and operated in a locked state, as shown in FIG. 3A. The sliding component 20 is locked on the rail 10, and a sufficient structural support capacity is provided through the combination of the sliding component 20 and the rail 10. In the embodiment, the sliding component 20 further includes an equipment-fixing seat 207 connected to the limiting portion 201 and the fixing component 203. The at least one guiding groove 202 is located between the limiting portion 201 and the equipment-fixing seat 207. Since the sliding component 20, the fixing component 203 and the rail 10 are made by sheet metal parts, for example, the locked state of the sliding component 20 is maintained on the rail 10 through the engagement of the positioning protrusion 206 and the positioning groove 106, and the structural support capacity greater than the conventional fixing method of the screw is further provided through the engagement of the positioning protrusion 206 and the positioning groove 106. It is beneficial for the sliding component 20 to be further combined with the equipment-fixing seat 207 for carrying and fixing the server equipment thereon and maintain the stability of the entire structure.

Please refer to FIG. 3B. On the other hand, in case of that the sliding component 20 needs to adjust the position relative to the rail 10, the fixing component 203 is detached and separated from the sliding body 200 in the reverse Y axial direction by the fastening element 204, and the positioning protrusion 206 disposed on the fixing component 203 is driven to be misaligned with the plurality of positioning grooves 106 in the first direction (i.e., the X axial direction), or release the interference fit of the corresponding positioning groove 106. Preferably but not exclusively, the fixing component 203 and the sliding body 200 are not detached and separated completely, but an appropriate distance is maintained therebetween, so that the positioning protrusion 206 is misaligned with the plurality of positioning grooves 106 in the first direction (i.e., the X axial direction), or release the interference fit of the corresponding positioning groove 106. Thus, the sliding component 20 is unlocked from the rail 10 and operated in an unlocked state, and the sliding component 20 is allowed to slide relative to the rail 10 in the first direction (i.e., the X axial direction), so as to adjust the position of the sliding component 20 relative to the rail 10. At this time, the positioning protrusion 206 of the sliding component 20 is allowed to select the other one of the plurality of positioning grooves 106 for matching.

Figure 4:
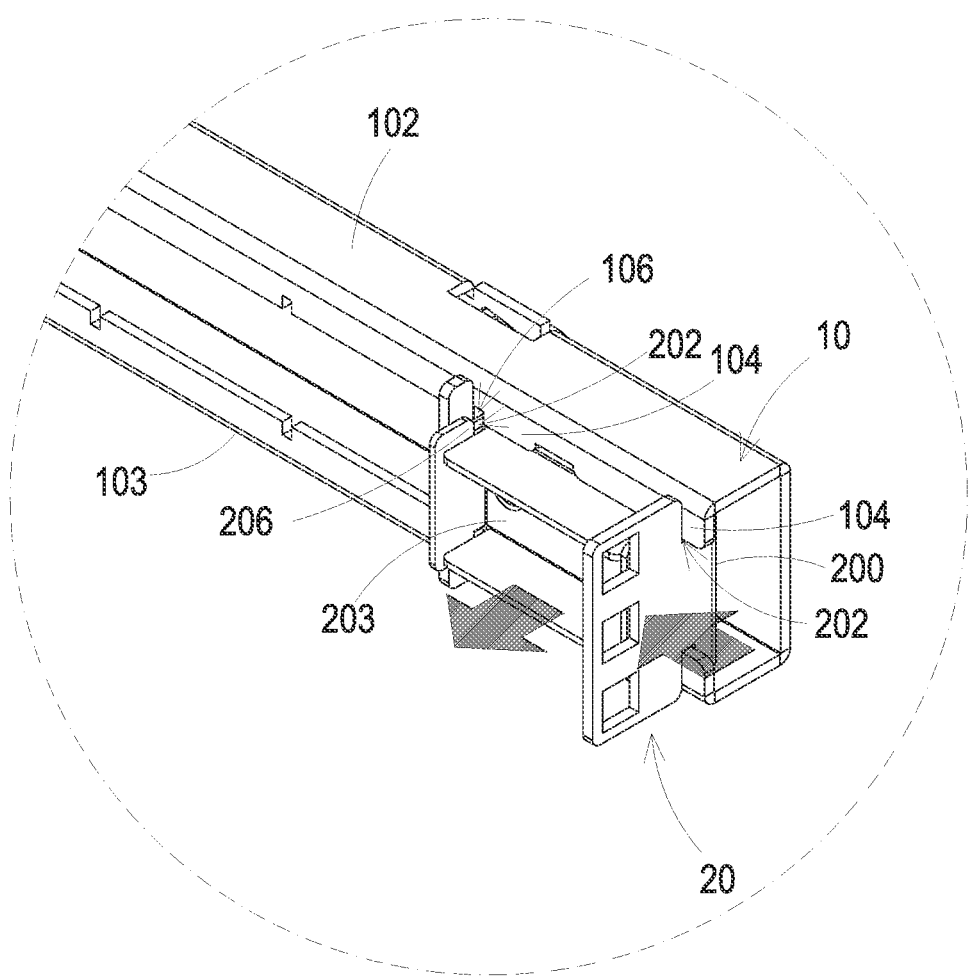
FIG. 4 is a schematic diagram illustrating the adjusting actions of the adjustable rack assembly according to the first embodiment of the present disclosure.

FIG. 4 is a schematic diagram illustrating the adjusting actions of the adjustable rack assembly according to the first embodiment of the present disclosure. Please refer to FIG. 1 to FIG. 4. When the sliding component 20 is fixed in a first position relative to the rail 10, as shown in FIG. 4, the sliding component 20 and the rail 10 are operated in the locked state. In case of that the sliding component 20 needs to move from the first position into the other position relative to the rail 10, the fastening element 204 is released by the user, so that the fixing component 203 is detached and separated from the sliding body 200 in the reverse Y axial direction. In that, the positioning protrusion 206 is moved away from the corresponding positioning groove 106, and the positioning protrusion 206 disposed on the fixing component 203 is driven to be misaligned with the plurality of positioning grooves 106 in the first direction (i.e., the X axial direction), or release the interference fit of the corresponding positioning groove 106. Thus, the sliding component 20 and the rail 10 are operated in the unlocked state. When the sliding component 20 and the rail 10 are operated in the unlocked state, the sliding component 20 is allowed to slide relative to the rail 10 in the first direction (i.e., the X axial direction). The sliding component 20 is allowed to slide in the first direction (i.e., the X axial direction) by the user, so as to select the other one of the plurality of positioning grooves 106 of the rail 10 for matching with the positioning protrusion 206 of the sliding component 20. When the positioning protrusion 206 disposed on the fixing component 203 is aligned with the other one of the plurality of positioning grooves 106 in the second direction (i.e., the Y axial direction), the fastening element 204 is operated by the user to move the fixing component 203 along the second direction (i.e., the Y axial direction) and then fix the fixing component 203 on the sliding body 200. In that, the positioning protrusion 206 disposed on the fixing component 203 and the other corresponding positioning groove 106 are engaged with each other or form an interference fit, and the sliding component 20 is locked on another position relative to the rail 10. Certainly, the adjusting actions of the adjustable rack assembly of the present disclosure is not limited thereto.

Figure 5:
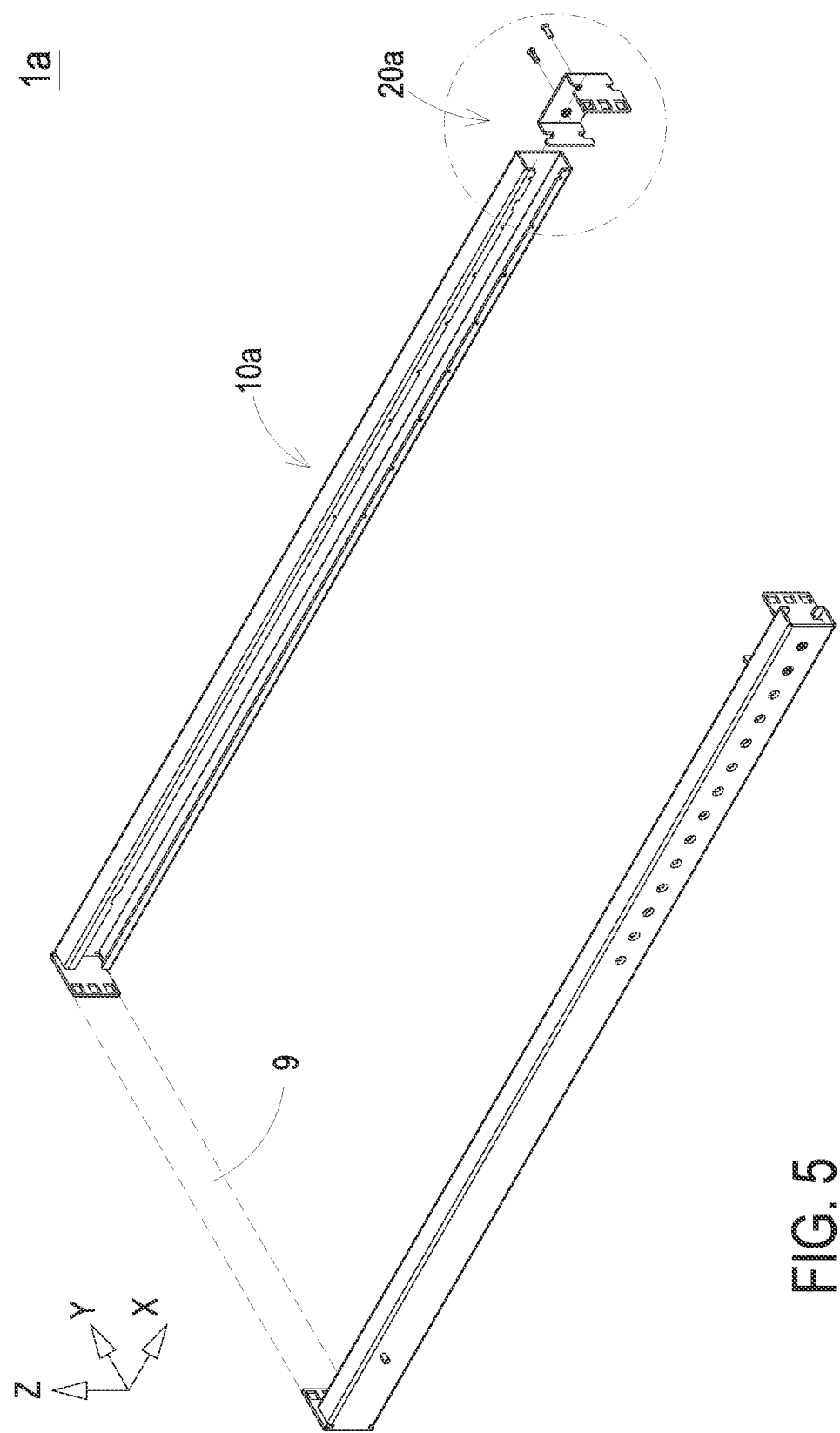
FIG. 5 is an exploded view illustrating an adjustable rack assembly according to a second embodiment of the present disclosure.
Figure 6:
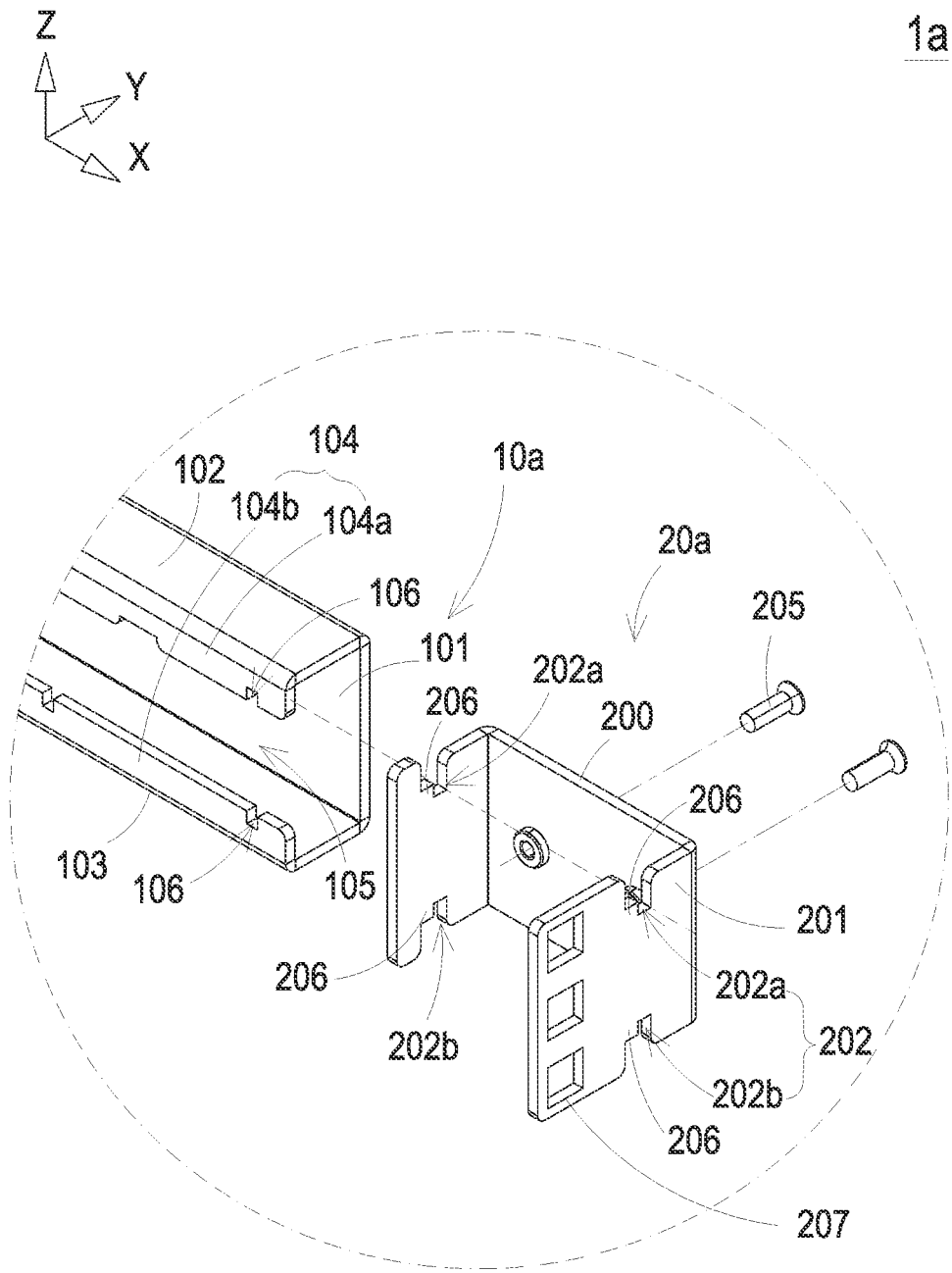
FIG. 6 is an enlarged and exploded view illustrating the adjustable rack assembly according to the second embodiment of the present disclosure.
Figure 7A:
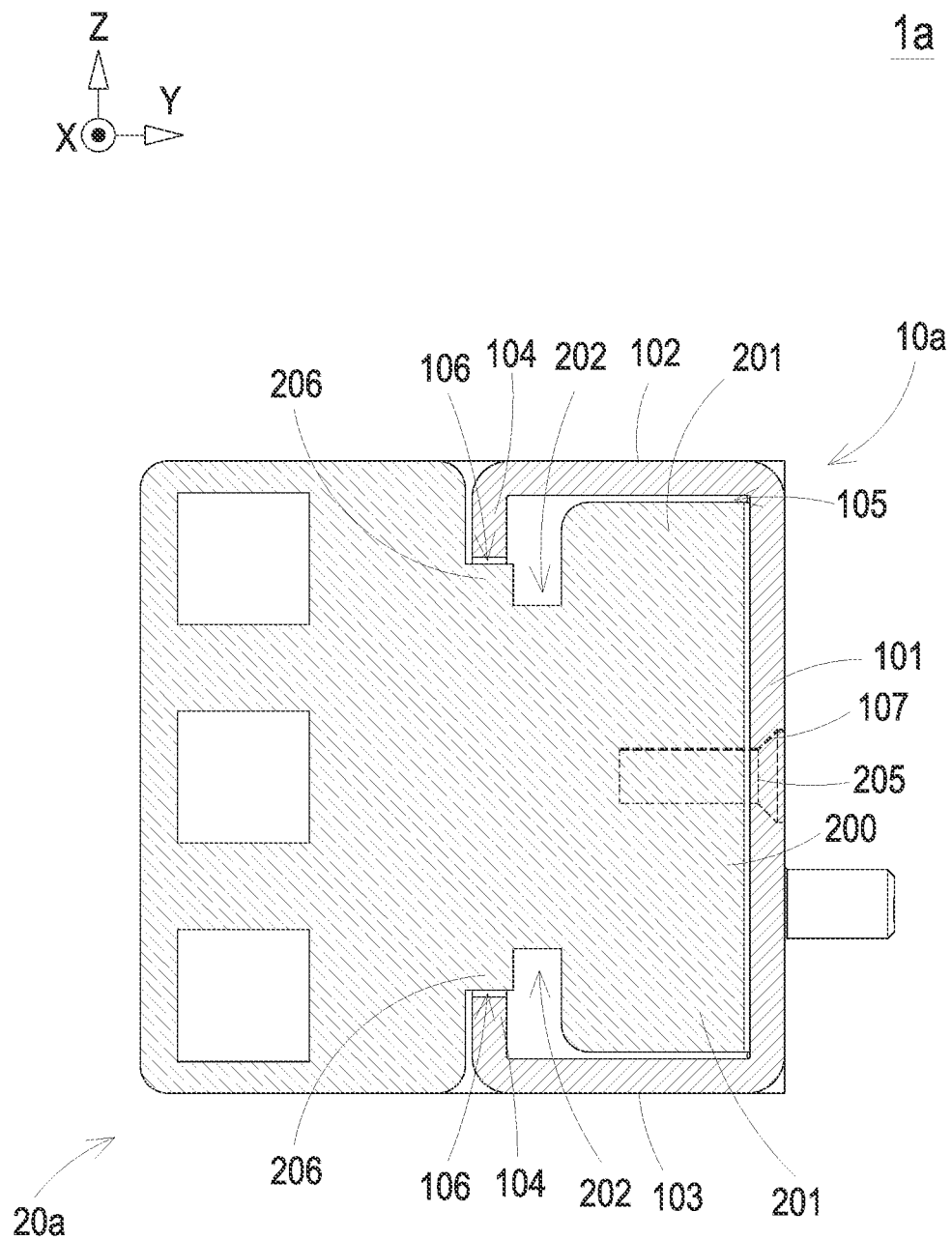
FIG. 7A is a cross-section view illustrating the adjustable rack assembly operated in a locked state according to the second embodiment of the present disclosure.
Figure 7B:
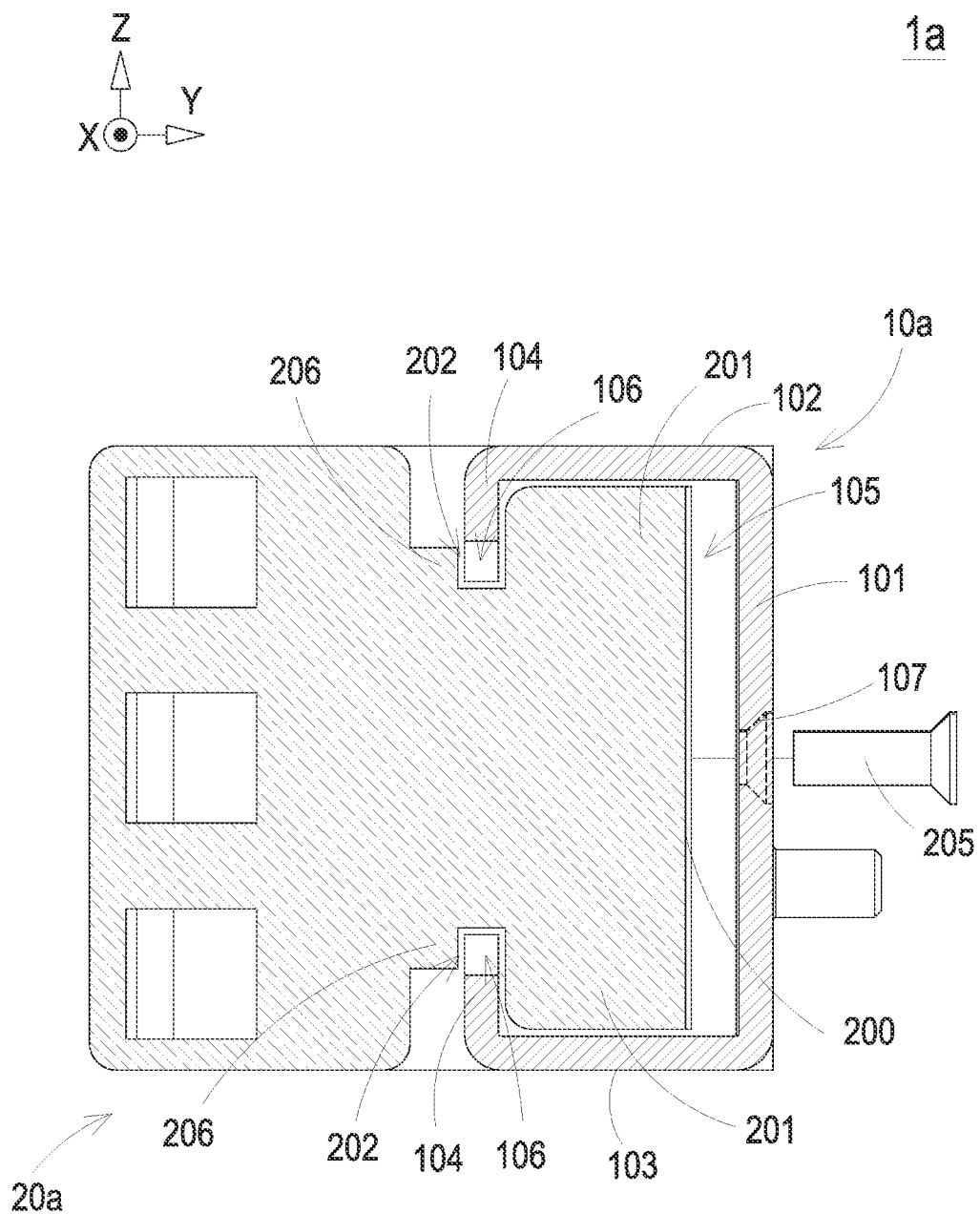
FIG. 7B is a cross-section view illustrating the adjustable rack assembly operated in an unlocked state according to the second embodiment of the present disclosure.

FIG. 5 is an exploded view illustrating an adjustable rack assembly according to a second embodiment of the present disclosure. FIG. 6 is an enlarged and exploded view illustrating the adjustable rack assembly according to the second embodiment of the present disclosure. FIGS. 7A and 7B are cross-section views respectively illustrating the adjustable rack assembly operated in a locked state and an unlocked state according to the second embodiment of the present disclosure. In the embodiment, the structures, elements and functions of the adjustable rack assembly 1a are similar to those of the adjustable rack assembly 1 of FIGS. 1 to 4, and are not redundantly described herein. In the embodiment, the sliding component 20a includes the positioning protrusion 206, the at least one guiding groove 202, the limiting portion 201 and the sliding body 200, which are made by a sheet metal part, integrally formed into one piece, and arranged along the second direction (i.e., the Y axial direction). Preferably but not exclusively, the at least one guiding groove 202 is located between the limiting portion 201 and the positioning protrusion 206. In the embodiment, the sliding body 200 and the limiting portion 201 of the sliding component 20a are received in the accommodation space 105 through an end of the rail 10a, so that the at least one guiding groove 202 and the at least one bent portion 104 are mutually matched with each other, and the sliding component is allowed to slide relative to the rail 10a in the first direction (i.e., the X axial direction). When the positioning protrusion 206 is aligned with one of the plurality of positioning grooves 106 of the rail 10a in the second direction (i.e., the Y axial direction), the sliding body 200 is allowed to be detachably connected to the rail body 101 along the second direction (i.e., the Y axial direction) through a fastening element 205 or a magnetic element, so that the positioning protrusion 206 is driven to displace and engage with the corresponding positioning groove 106. Thus, the sliding component 20a is locked on the rail 10a and operated in a locked state, as shown in FIG. 7A. The sliding component 20a is locked on the rail 10a, and a sufficient structural support capacity is provided through the combination of the sliding component 20a and the rail 10. In the embodiment, when the sliding body 200 is detached and separated from the rail body 101, the positioning protrusion 206 is driven to be misaligned with the plurality of positioning grooves 106 in the first direction, and the sliding component 20a is allowed to slide relative to the rail 10a in the first direction.

On the other hand, in case of that the sliding component 20a needs to adjust the position relative to the rail 10a, the sliding body 200 is detached and separated from the rail body 101 in the reverse Y axial direction by the fastening element 205, and the positioning protrusion 206 is driven to be misaligned with the plurality of positioning grooves 106 in the first direction (i.e., the X axial direction). Thus, the sliding component 20a and the rail 10a are operated in an unlocked state, as shown in FIG. 7B. The sliding component 20a is allowed to slide relative to the rail 10a in the first direction (i.e., the X axial direction), so as to adjust the position of the sliding component 20a relative to the rail 10a.

Please refer to FIG. 6 and FIG. 7A. In the embodiment, the rail 10a includes a plurality of fastening aperture 107 disposed on the rail body 101 along the first direction (i.e., the X axial direction). When the positioning protrusion 206 is aligned with one of the plurality of positioning grooves 106 in the second direction (i.e., the Y axial direction), the fastening element 205 passes through one of the plurality of fastening apertures 107 to connect the sliding body 200 with the rail body 101, drives the sliding component 20a to displace in the second direction (i.e., the Y axial direction), so that the at least one guiding groove 202 and the at least one bent portion 104 are misaligned with each other in the first direction (i.e., the X axial direction), and the positioning protrusion 206 displaced along the second direction (i.e., the Y axial direction) is engaged with the corresponding positioning groove 106, thereby the sliding component 20a being locked on the rail 10a. In other embodiments, the connection and disengagement of the sliding body 200 and the rail body 101 are achieved through a magnetic element. The present disclosure is not limited thereto and not redundantly described hereafter.

Figure 8:
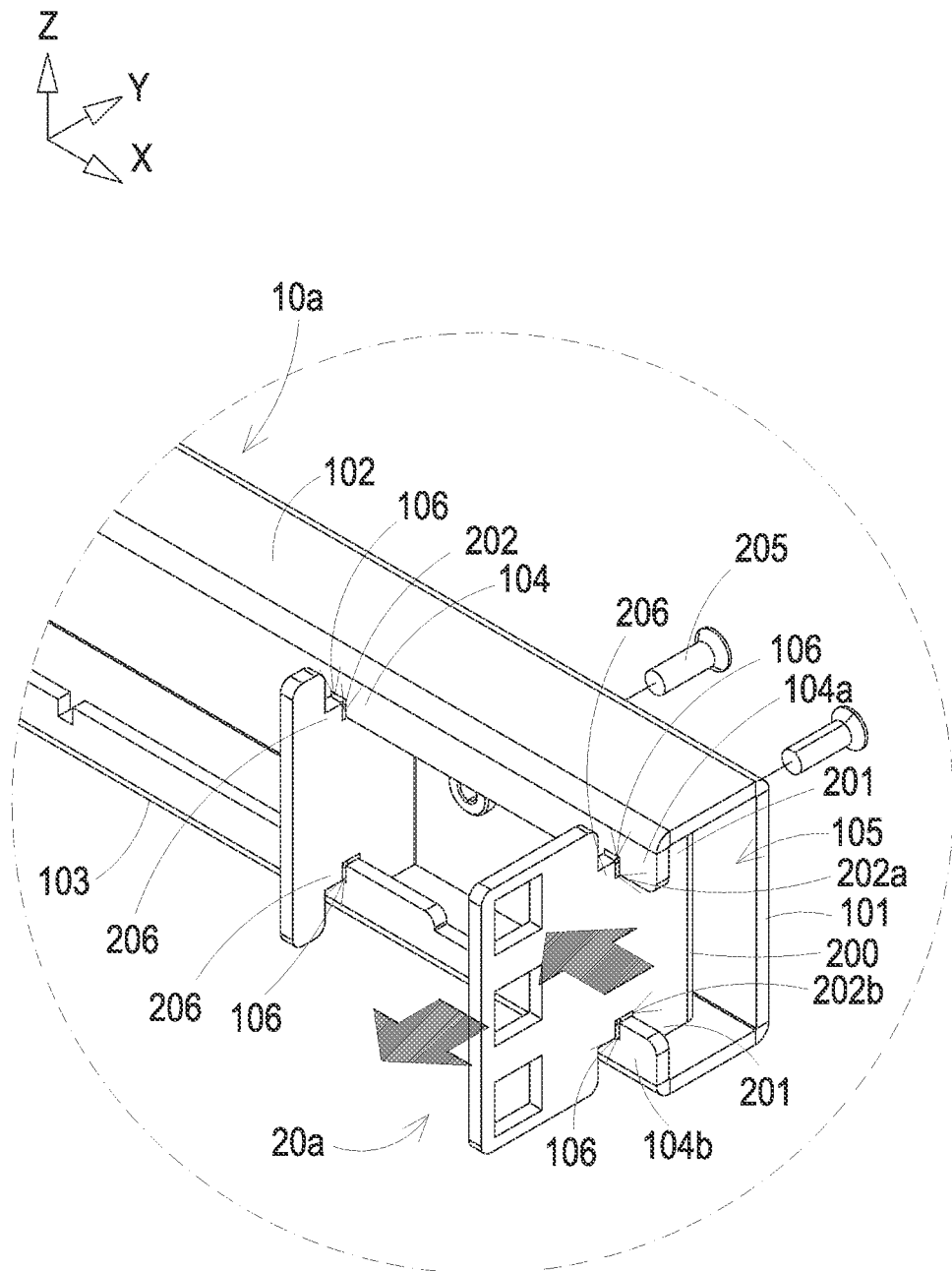
FIG. 8 is a schematic diagram illustrating the adjusting actions of the adjustable rack assembly according to the second embodiment of the present disclosure.

FIG. 8 is a schematic diagram illustrating the adjusting actions of the adjustable rack assembly according to the second embodiment of the present disclosure. Please refer to FIGS. 5 to 8. When the sliding component 20a is fixed in a first position relative to the rail 10a, as shown in FIG. 8, the sliding component 20a and the rail 10a are operated in the locked state. In case of that the sliding component 20a needs to move from the first position into the other position relative to the rail 10a, the fastening element 205 is released by the user, so that the sliding body 200 is detached and separated from the rail body 101 in the reverse Y axial direction. In that, the positioning protrusion 206 is moved away from the corresponding positioning groove 106, and the positioning protrusion 206 is driven to be misaligned with the plurality of positioning grooves 106 in the first direction (i.e., the X axial direction), as shown in FIG. 7B. Thus, the sliding component 20a and the rail 10a are operated in the unlocked state. When the sliding component 20a and the rail 10a are operated in the unlocked state, the sliding component 20a is allowed to slide relative to the rail 10a in the first direction (i.e., the X axial direction). Namely, the sliding component 20a is allowed to slide in the first direction (i.e., the X axial direction) by the user, so as to select the other one of the plurality of positioning grooves 106 of the rail 10a for matching with the positioning protrusion 206 of the sliding component 20a. When the positioning protrusion 206 of the sliding component 20a is aligned with the other one of the plurality of positioning grooves 106 in the second direction (i.e., the Y axial direction), the fastening element 205 is operated by the user to move the sliding body 200 along the second direction (i.e., the Y axial direction) and then fix the sliding body 200 on the rail body 101. In that, the at least one guiding groove 202 and the at least one bent portion 104 are misaligned in the first direction (i.e., the X axial direction), and the positioning protrusion 206 and the other corresponding positioning groove 106 are engaged with each other, as shown in FIG. 7A. The sliding component 20a is locked on another position relative to the rail 10a. Certainly, the adjusting actions of the adjustable rack assembly 1a of the present disclosure are not limited thereto.

Figure 9:
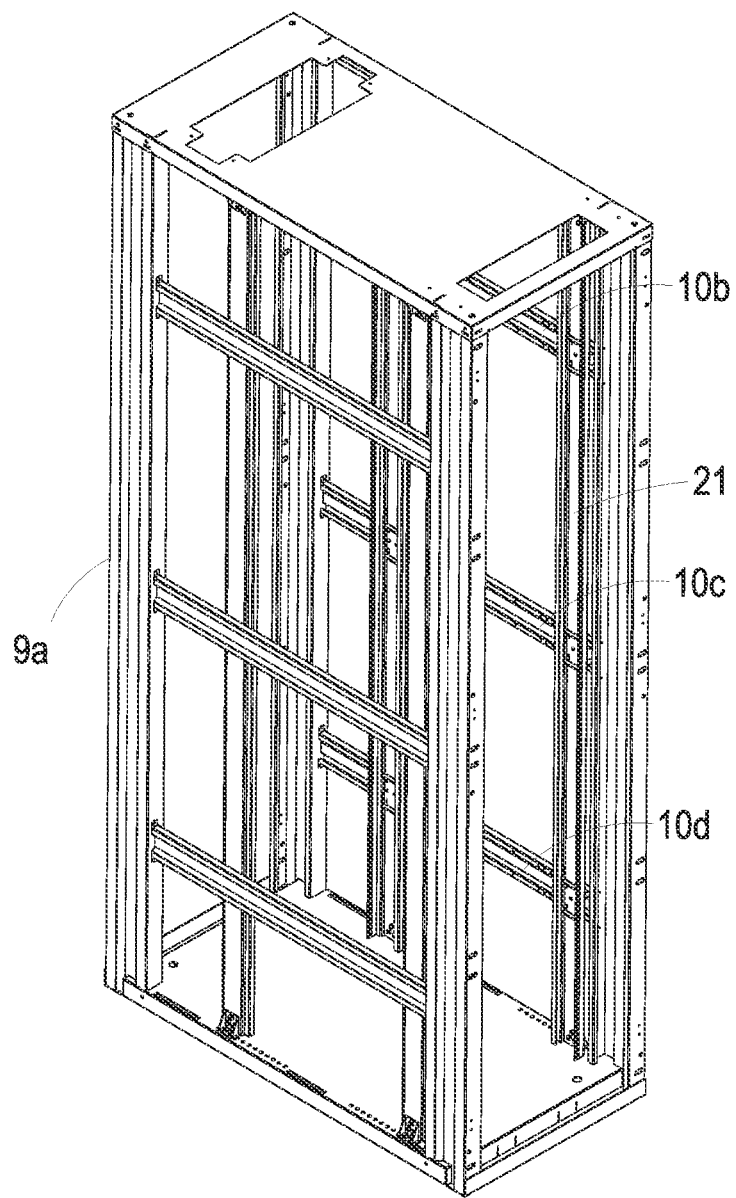
FIG. 9 is a perspective structural view illustrating an adjustable rack assembly according to a third embodiment of the present disclosure.
Figure 10:
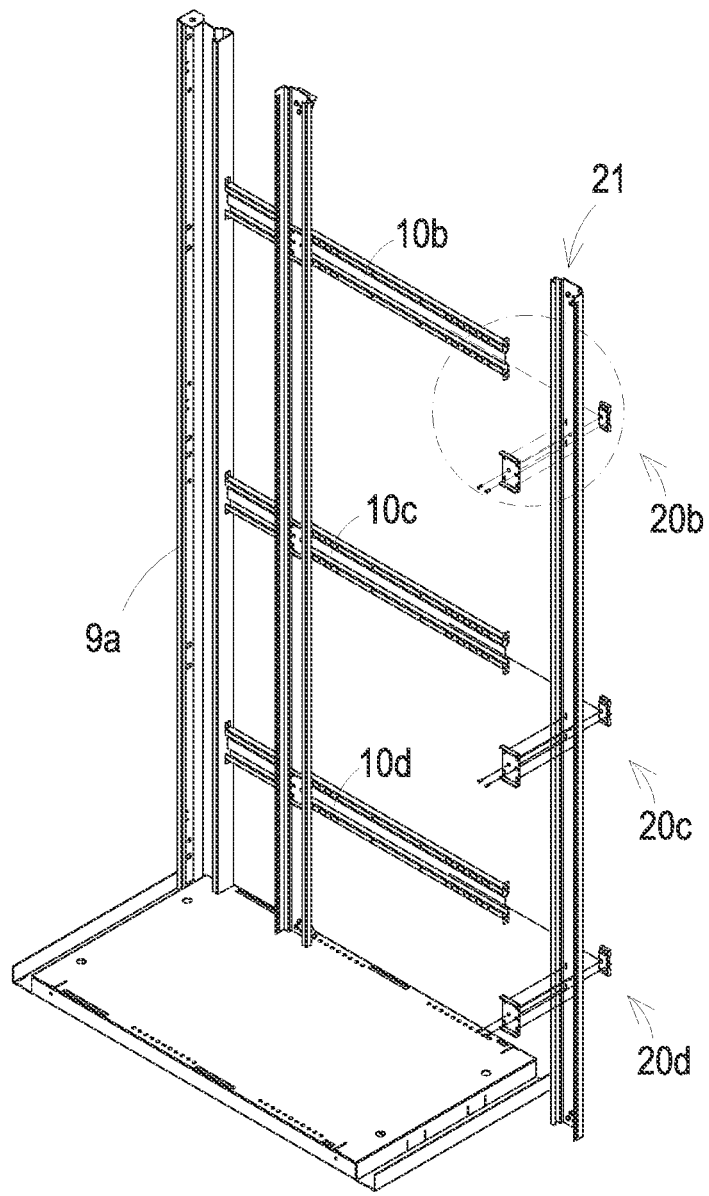
FIG. 10 is an exploded view illustrating the adjustable rack assembly according to the third embodiment of the present disclosure.
Figure 11:
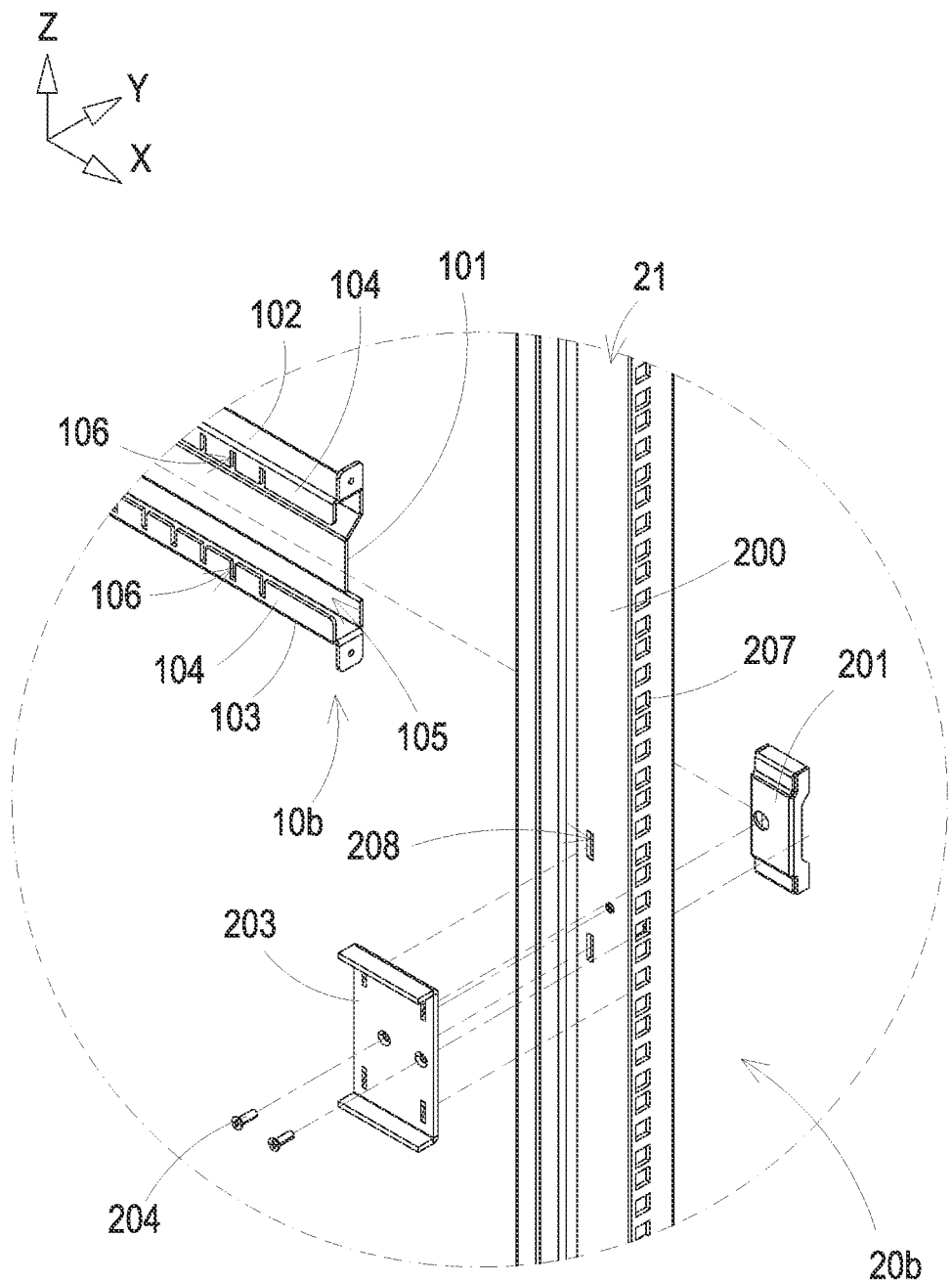
FIG. 11 is an enlarged and exploded view illustrating the adjustable rack assembly according to the third embodiment of the present disclosure.
Figure 12A:
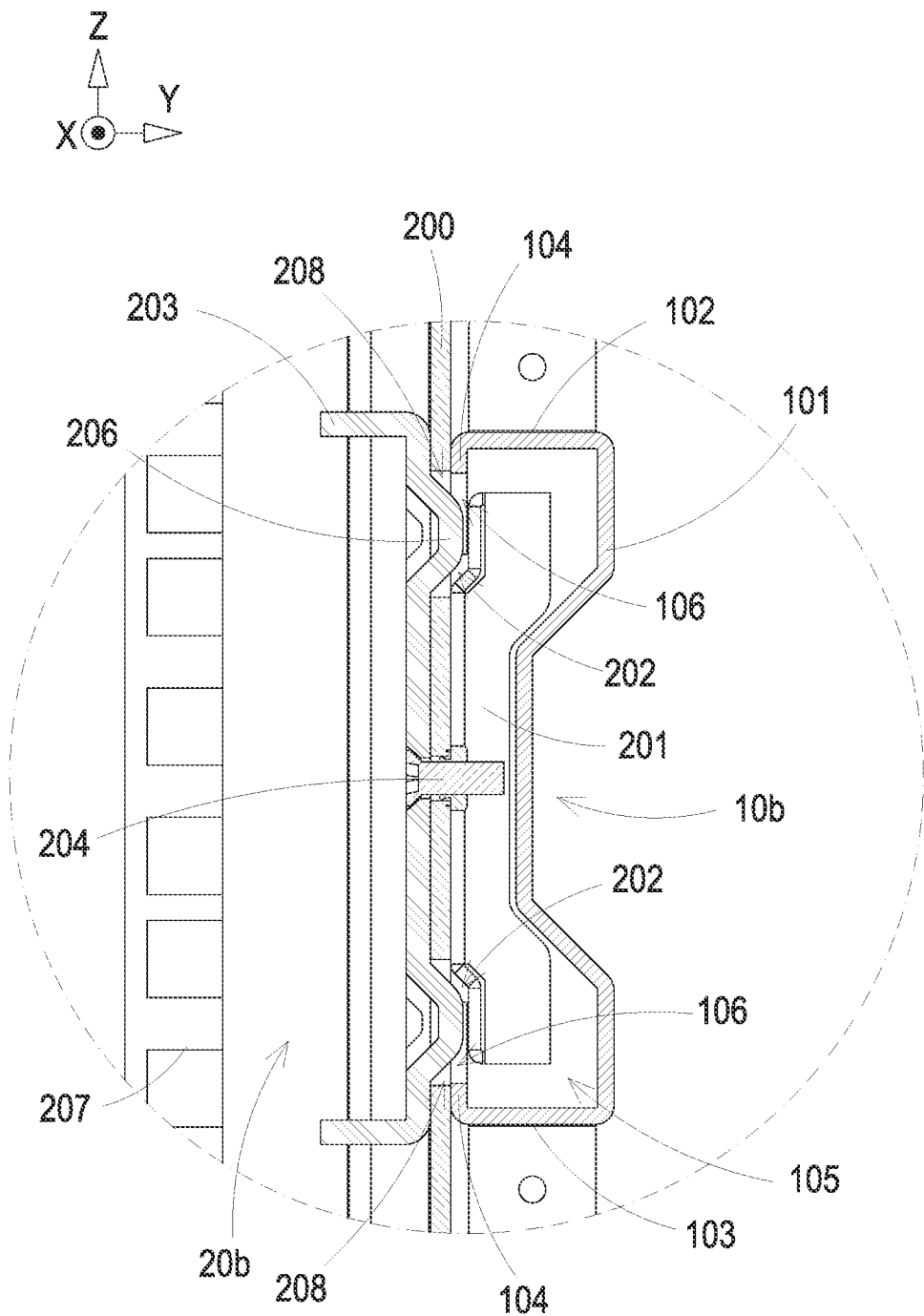
FIG. 12A is a cross-section view illustrating the adjustable rack assembly operated in a locked state according to the third embodiment of the present disclosure.
Figure 12B:
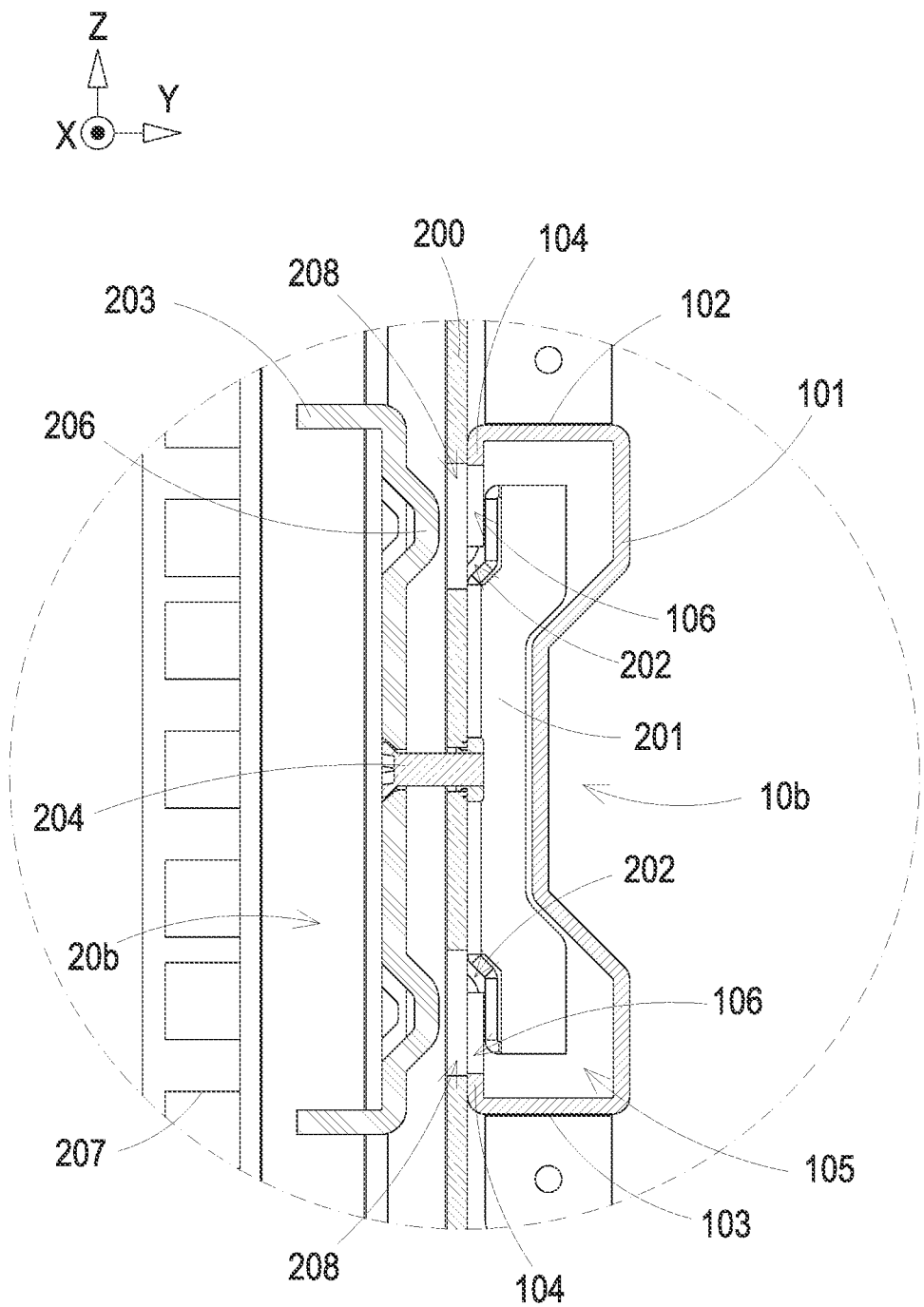
FIG. 12B is a cross-section view illustrating the adjustable rack assembly operated in an unlocked state according to the third embodiment of the present disclosure.

FIG. 9 is a perspective structural view illustrating an adjustable rack assembly according to a third embodiment of the present disclosure. FIG. 10 is an exploded view illustrating the adjustable rack assembly according to the third embodiment of the present disclosure. FIG. 11 is an enlarged and exploded view illustrating the adjustable rack assembly according to the third embodiment of the present disclosure. FIGS. 12A and 12B are cross-section views respectively illustrating the adjustable rack assembly operated in a locked state and an unlocked state according to the third embodiment of the present disclosure. In the embodiment, the structures, elements and functions of the adjustable rack assembly 1b are similar to those of the adjustable rack assembly 1 of FIGS. 1 to 4, and are not redundantly described herein. In the embodiment, the adjustable rack assembly 1b includes at least two rack units constructed on an upright or lying down frame of a cabinet 9a. Preferably but not exclusively, in the embodiment, there are three rack units combined to form the adjustable rack assembly 1b. A rail 10b and a sliding component 20b are mutually matched to form an upper rack unit, a rail 10c and a sliding component 20c are mutually matched to form a middle rack unit, and a rail 10d and a sliding component 20d are mutually matched to form a lower rack unit. The number of the rack units is adjustable according to the practical requirements. In other embodiments, any one of the three rack units is omitted, and the present disclosure is not limited thereto. In the embodiment, the rail 10b, the rail 10c and the rail 10d are arranged in parallel to each other along the first direction (i.e., the X axial direction). The sliding bodies of the sliding component 20b, the sliding component 20c and the sliding component 20d are extended along a third direction (i.e., the Z axial direction), and connected with each other to form a column structure 21. In that, the sliding component 20b, the sliding component 20c and the sliding component 20d are allowed to adjust synchronously the positions relative to the rail 10b, the rail 10c and the rail 10d in the first direction (i.e., the X axial direction). The upper rack unit of the sliding component 20b and the rail 10b is taken as an example for description in the following, but the present disclosure is not limited thereto.

In the embodiment, the sliding body 200, the at least guiding groove 202 and the limiting portion 201 are arranged along the second direction (i.e., the Y axial direction), and the at least one guiding groove 202 is located between the sliding body 200 and the limiting portion 201. When the at least one guiding groove 202 of the sliding component 20b and the bent portion 104 of the rail 10b are mutually matched, the limiting portion 201 is received in the accommodation space 105. Moreover, in the embodiment, the sliding component 20b includes a fixing component 203. The fixing component 203 is configured to be fixed to the sliding body 200 along the second direction (i.e., the Y axial direction) through a fastening element 204. The positioning protrusion 206 is disposed on the fixing component 203. The sliding body 200 further includes at least one positioning hole 208, which is spatially corresponding to the positioning protrusion 206 and one of the plurality of positioning grooves 106 of the rail 10b. In the embodiment, the sliding body 200 of the sliding component 20b and the limiting portion 201 are designed to be detachable, and the at least one guiding groove 202 are formed and disposed between the sliding body 200 and the limiting portion 201 after the sliding body 200 and the limiting portion 201 are connected together. Preferably but not exclusively, in the embodiment, the limiting portion 201 of the sliding component 20b is received in the accommodation space 105 and then connected with the sliding body 200, so that the at least one guiding groove 202 and the at least one bent portion 104 are mutually matched with each other, and the sliding component 20b is allowed to slide relative to the rail 10b in the first direction (i.e., the X axial direction). In the embodiment, when the positioning protrusion 206 is aligned to one of the plurality of positioning grooves 106 in the second direction (i.e., the Y axial direction), the fixing component 203 is allowed to be fixed to the sliding body 200 along the second direction. At this time, the positioning protrusion 206 passes through the corresponding positioning hole 208 and is engaged with the corresponding positioning groove 106, so that the sliding component 20b is locked on the rail 10b to achieve a locked state, as shown in FIG. 12A. Thereby, the column structure 21 further provides a sufficient structural support capacity through the combination of the sliding components 20b, 20c, 20d and the rails 10b, 10c, 10d, and the structural support capacity of the adjustable rack assembly 1b is enhanced.

On the other hand, in case of that the sliding component 20b needs to adjust the position relative to the rail 10b, the fixing component 203 is detached and separated from the sliding body 200 in the reverse Y axial direction by the fastening element 204, and the positioning protrusion 206 disposed on the fixing component 203 is driven to be misaligned with the plurality of positioning grooves 106 in the first direction (i.e., the X axial direction). Preferably but not exclusively, the fixing component 203 and the sliding body 200 are not detached and separated completely, but an appropriate distance is maintained therebetween, so that the positioning protrusion 206 is misaligned with the plurality of positioning grooves 106 in the first direction (i.e., the X axial direction). Thus, the sliding component 20b is unlocked from the rail 10b and operated in an unlocked state, as shown in FIG. 12B. When the sliding component 20b and the rail 10b are operated in the unlocked state, the sliding component 20b is allowed to slide relative to the rail 10b in the first direction (i.e., the X axial direction). Namely, the position adjustment of column structure 21 (referred to FIG. 10) is achieved by adjusting the positions of the sliding components 20b, 20c, 20c relative to the rails 10b, 10c, 10d.

In the embodiment, the column structure 21, which is formed by connecting the sliding bodies 200 of the sliding components 20b, 20c, further includes an equipment-fixing seat 207. Preferably but not exclusively, the equipment-fixing seat 207 is integrally formed with the sliding body 200, and extended along the third direction (i.e., the Z-axis direction). It is more conducive to carrying and fixing a large-sized server equipment. Whereby, the structural support capacity of the adjustable rack assembly 1b is further enhanced, the variety of applications are increased, and the competitiveness of products is enhanced.

Figure 13:
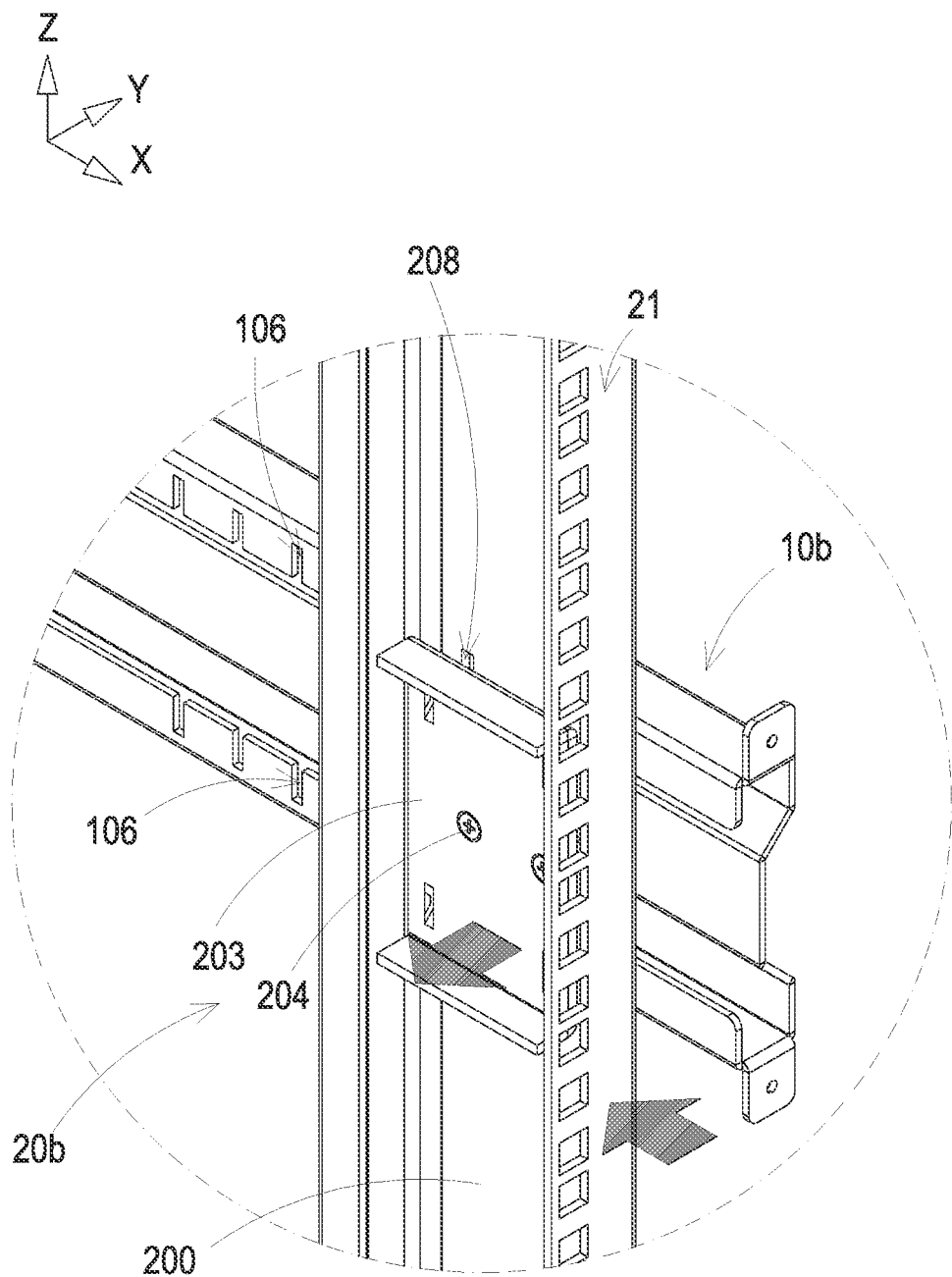
FIG. 13 is a schematic diagram illustrating the adjusting actions of the adjustable rack assembly according to the third embodiment of the present disclosure.

FIG. 13 is a schematic diagram illustrating the adjusting actions of the adjustable rack assembly according to the third embodiment of the present disclosure. Please refer to FIGS. 11 to 13. When the sliding component 20b is fixed in a first position relative to the rail 10b, as shown in FIG. 13, the sliding component 20b and the rail 10b are operated in the locked state. In case of that the sliding component 20b needs to move from the first position into the other position relative to the rail 10b, the fastening element 204 is released by the user, so that the fixing component 203 is detached and separated from the sliding body 200 in the reverse Y axial direction, as shown in FIG. 12B. In that, the positioning protrusion 206 is moved away from the corresponding positioning groove 106, and the positioning protrusion 206 disposed on the fixing component 203 is driven to be misaligned with the plurality of positioning grooves 106 in the first direction (i.e., the X axial direction). Thus, the sliding component 20b and the rail 10b are operated in the unlocked state. When the sliding component 20b and the rail 10b are operated in the unlocked state, the sliding component 20b is allowed to slide relative to the rail 10b in the first direction (i.e., the X axial direction). The sliding component 20b is allowed to slide in the first direction (i.e., the X axial direction) by the user, so as to select the other one of the plurality of positioning grooves 106 of the rail 10b for matching with the positioning protrusion 206 of the sliding component 20b. When the positioning protrusion 206 disposed on the fixing component 203 is aligned with the other one of the plurality of positioning grooves 106 in the second direction (i.e., the Y axial direction), the fastening element 204 is operated by the user to move the fixing component 203 along the second direction (i.e., the Y axial direction) and then fix the fixing component 203 on the sliding body 200. In that, the positioning protrusion 206 disposed on the fixing component 203 and the other corresponding positioning groove 106 are engaged with each other, and the sliding component 20b is locked on another position relative to the rail 10b. Certainly, the adjusting actions of the adjustable rack assembly 1b of the present disclosure are not limited thereto.

In summary, the present disclosure provides an adjustable rack assembly and a cabinet using the same. A sliding component and a rail made by sheet metal parts are adjusted in an aligned arrangement or misaligned arrangement of a first direction and a second direction, so as to achieve the position adjustment of an equipment-fixing seat thereof. Compared with the conventional rack assembly simply fixed through a screw, an enhanced supporting for the equipment carried on the rack assembly is provided through the engagement between the sliding component and the rail made by sheet metal parts, and the adjustment process is simplified. In addition, by matching a positioning protrusion with one of the plurality of positioning grooves on the rail, the sliding component is operated in a locked state or an unlocked state on the rail extended along a first direction. The positioning protrusion is integrally formed on the sliding body of the sliding component or combined with a fixing component. Moreover, the positioning protrusion is driven to displace in a second direction by a fastening element or a magnetic element. When the positioning protrusion is engaged with the positioning groove of the rail in the first direction, the sliding component is operated in the locked state, so that the sliding component is locked on the rail firmly. When the positioning protrusion is misaligned with the positioning groove of the rail in the first direction, the sliding component is operated in the unlocked state, so that the sliding component is allowed to slide relative to the rail in the first direction. Since the sliding component, the fixing component and the rail are made by sheet metal parts, for example, the locked state of the sliding component is maintained through the engagement of the positioning protrusion and the positioning groove, and the structural support capacity greater than the conventional fixing method of the screw is further provided through the engagement of the positioning protrusion and the positioning groove. It is beneficial for the sliding component to be further combined with an equipment-fixing seat for carrying and fixing the server equipment thereon and maintaining the stability of the entire structure. In addition, the rail and the sliding component are allowed to be paired and form a rack unit in use. When the sliding body of the sliding component is extended along a third direction, the sliding bodies of the two rack units are further connected with each other to form a column structure, which is constructed between the two rack units arranged along the first direction and parallel to each other. Thus, the structural support capacity of the adjustable rack assembly is further enhanced, the varieties of applications are increased, and the competitiveness of products is enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An adjustable rack assembly comprising:
a rail extended along a first direction and comprising a rail body, at least one bent portion and a plurality of positioning grooves, wherein the at least one bent portion protrudes inwardly from an outer edge of the rail body to form an accommodation space, and the plurality of positioning grooves are disposed on the bent portion and arranged along the first direction; and
a sliding component comprising a sliding body, a limiting portion and at least one guiding groove, wherein the at least one guiding groove is spatially corresponding to the at least one bent portion, the limiting portion is connected to the sliding body and accommodated in the accommodation space, and the at least one guiding groove and the at least one bent portion are mutually matched, wherein when the sliding component is misaligned with the plurality of positioning grooves in the first direction, the sliding component is allowed to slide relative to the rail in the first direction, wherein when the sliding component is engaged with one of the plurality of positioning grooves on the rail, the sliding component is locked on the rail,
wherein the sliding component comprises a positioning protrusion and a fixing component, the positioning protrusion is disposed on the fixing component, and the fixing component is configured to be fixed to the sliding body along a second direction, wherein when the positioning protrusion is aligned with one of the plurality of positioning grooves of the rail in the second direction, the fixing component is allowed to be fixed on the sliding body along the second direction, and the positioning protrusion and the corresponding positioning groove are driven to engage with each other, and the sliding component is locked on the rail, wherein when the fixing component is detached and separated from the sliding body, the positioning protrusion is driven to be misaligned with the plurality of positioning grooves in the first direction, and the sliding component is allowed to slide relative to the rail in the first direction.

2. The adjustable rack assembly according to claim 1, wherein the positioning protrusion is spatially corresponding to one of the plurality of positioning grooves, wherein when the positioning protrusion is aligned with one of the plurality of positioning grooves in the second direction, the positioning protrusion is allowed to displace along the second direction, wherein the second direction is not parallel to the first direction.

3. The adjustable rack assembly according to claim 2, wherein the sliding component is made by a sheet metal part, and the sliding body, and the limiting portion and the at least one guiding groove are integrally formed, wherein when the at least one guiding groove is matched with the at least one bent portion of the rail, the sliding body and the limiting portion are received in the accommodation space.

4. The adjustable rack assembly according to claim 3, wherein the positioning protrusion, the at least one guiding groove, the limiting portion and the sliding body are integrally formed into one piece, and arranged along the second direction, and the at least one guiding groove is located between the limiting portion and the positioning protrusion, wherein when the positioning protrusion is aligned with one of the plurality of positioning grooves in the second direction, the sliding body is detachably connected to the rail body through a fastening element or a magnetic element, so that the positioning protrusion and the corresponding positioning groove are engaged with each other, and the sliding component is locked on the rail, wherein when the sliding body is detached and separated from the rail body, the positioning protrusion is driven to be misaligned with the plurality of positioning grooves in the first direction, and the sliding component is allowed to slide relative to the rail in the first direction.

5. The adjustable rack assembly according to claim 4, wherein the rail comprises a plurality of fastening apertures disposed on the rail body along the first direction, wherein when the positioning protrusion is aligned with one of the plurality of positioning grooves in the second direction, the fastening element passes through one of the plurality of fastening apertures to connect the sliding body with the rail body, drives the sliding component to displace in the second direction, so that the at least one guiding groove and the at least one bent portion are misaligned with each other in the first direction, and the positioning protrusion displaced along the second direction is engaged with the corresponding positioning groove, thereby the sliding component being locked on the rail.

6. The adjustable rack assembly according to claim 2, wherein the sliding body, the at least one guiding groove and the limiting portion are arranged along the second direction, and the at least one guiding groove is located between the sliding body and the limiting portion, wherein when the at least one guiding groove and the bent portion of the rail are matched, the limiting portion is received in the accommodation space.

7. The adjustable rack assembly according to claim 6, wherein the sliding component comprises a fixing component, the fixing component is configured to be fixed to the sliding body along the second direction, and the positioning protrusion is disposed on the fixing component, wherein the sliding body comprises at least one positioning hole spatially corresponding to the positioning protrusion and one of the plurality of positioning grooves, wherein when the positioning protrusion is aligned to one of the plurality of positioning grooves in the second direction, the fixing component is allowed to be fixed to the sliding body along the second direction, the positioning protrusion passes through the positioning hole and is engaged with the corresponding positioning groove, so that the sliding component is locked on the rail, wherein when the fixing component is detached and separated from the sliding body, the positioning protrusion is driven to be misaligned with the plurality of positioning grooves in the first direction, and the sliding component is allowed to slide relative to the rail in the first direction.

8. The adjustable rack assembly according to claim 7, wherein the rail and the sliding component are paired to form a rack unit, at least two of the rack units have the rails arranged in parallel to each other along the first direction, and the sliding bodies of the rack units are extended along a third direction and connected with each other to form a column structure, wherein the first direction, the second direction and the third direction are perpendicular to each other.

9. The adjustable rack assembly according to claim 1, wherein the fixing component is made by a sheet metal part, the fixing component and the positioning protrusion are integrally formed, and the fixing component is detachably disposed on the sliding body through a fastening element or a magnetic element.

10. A cabinet comprising:
an adjustable rack assembly comprising:
a rail extended along a first direction and comprising a rail body, at least one bent portion and a plurality of positioning grooves, wherein the at least one bent portion protrudes inwardly from an outer edge of the rail body to form an accommodation space, and the plurality of positioning grooves are disposed on the bent portion and arranged along the first direction; and a sliding component comprising a sliding body, a limiting portion and at least one guiding groove, wherein the at least one guiding groove is spatially corresponding to the at least one bent portion, the limiting portion is connected to the sliding body and accommodated in the accommodation space, and the at least one guiding groove and the at least one bent portion are mutually matched, wherein when the sliding component is misaligned with the plurality of positioning grooves in the first direction, the sliding component is allowed to slide relative to the rail in the first direction, wherein when the sliding component is engaged with one of the plurality of positioning grooves on the rail, the sliding component is locked on the rail, wherein the sliding component comprises a positioning protrusion and a fixing component, the positioning protrusion is disposed on the fixing component, and the fixing component is configured to be fixed to the sliding body along a second direction, wherein when the positioning protrusion is aligned with one of the plurality of positioning grooves of the rail in the second direction, the fixing component is allowed to be fixed on the sliding body along the second direction, and the positioning protrusion and the corresponding positioning groove are driven to engage with each other, and the sliding component is locked on the rail, wherein when the fixing component is detached and separated from the sliding body, the positioning protrusion is driven to be misaligned with the plurality of positioning grooves in the first direction, and the sliding component is allowed to slide relative to the rail in the first direction.

11. The cabinet according to claim 10, wherein the positioning protrusion is spatially corresponding to one of the plurality of positioning grooves, wherein when the positioning protrusion is aligned with one of the plurality of positioning grooves in the second direction, the positioning protrusion is allowed to displace along the second direction, wherein the second direction is not parallel to the first direction.

12. The cabinet according to claim 11, wherein the sliding component is made by a sheet metal part, and the sliding body, and the limiting portion and the at least one guiding groove are integrally formed, wherein when the at least one guiding groove is matched with the at least one bent portion of the rail, the sliding body and the limiting portion are received in the accommodation space.

13. The cabinet according to claim 12, wherein the positioning protrusion, the at least one guiding groove, the limiting portion and the sliding body are integrally formed into one piece, and arranged along the second direction, and the at least one guiding groove is located between the limiting portion and the positioning protrusion, wherein when the positioning protrusion is aligned with one of the plurality of positioning grooves in the second direction, the sliding body is detachably connected to the rail body through a fastening element or a magnetic element, so that the positioning protrusion and the corresponding positioning groove are engaged with each other, and the sliding component is locked on the rail, wherein when the sliding body is detached and separated from the rail body, the positioning protrusion is driven to be misaligned with the plurality of positioning grooves in the first direction, and the sliding component is allowed to slide relative to the rail in the first direction.

14. The cabinet according to claim 13, wherein the rail comprises a plurality of fastening apertures disposed on the rail body along the first direction, wherein when the positioning protrusion is aligned with one of the plurality of positioning grooves in the second direction, the fastening element passes through one of the plurality of fastening apertures to connect the sliding body with the rail body, drives the sliding component to displace in the second direction, so that the at least one guiding groove and the at least one bent portion are misaligned with each other in the first direction, and the positioning protrusion displaced along the second direction is engaged with the corresponding positioning groove, thereby the sliding component being locked on the rail.

15. The cabinet according to claim 11, wherein the sliding body, the at least one guiding groove and the limiting portion are arranged along the second direction, the at least one guiding groove is located between the sliding body and the limiting portion, wherein when the at least one guiding groove and the bent portion of the rail are matched, the limiting portion is received in the accommodation space.

16. The cabinet according to claim 15, wherein the sliding component comprises a fixing component, the fixing component is configured to be fixed to the sliding body along the second direction, and the positioning protrusion is disposed on the fixing component, wherein the sliding body comprises at least one positioning hole spatially corresponding to the positioning protrusion and one of the plurality of positioning grooves, wherein when the positioning protrusion is aligned to one of the plurality of positioning grooves in the second direction, the fixing component is allowed to be fixed to the sliding body along the second direction, the positioning protrusion passes through the positioning hole and is engaged with the corresponding positioning groove, so that the sliding component is locked on the rail, wherein when the fixing component is detached and separated from the sliding body, the positioning protrusion is driven to be misaligned with the plurality of positioning grooves in the first direction, and the sliding component is allowed to slide relative to the rail in the first direction.

17. The cabinet according to claim 16, wherein the rail and the sliding component are paired to form a rack unit, at least two of the rack units have the rails arranged in parallel to each other along the first direction, and the sliding bodies of the rack units are extended along a third direction and connected to form a column structure, wherein the first direction, the second direction and the third direction are perpendicular to each other.

18. The cabinet according to claim 10, wherein the fixing component is made by a sheet metal part, the fixing component and the positioning protrusion are integrally formed, and the fixing component is detachably disposed on the sliding body through a fastening element or a magnetic element.

* * * * *